US010216559B2

(12) United States Patent
Fernandez

(10) Patent No.: US 10,216,559 B2
(45) Date of Patent: Feb. 26, 2019

(54) DIAGNOSTIC FAULT COMMUNICATION

(71) Applicant: Allegro MicroSystems, LLC, Worcester, MA (US)

(72) Inventor: Devon Fernandez, Londonderry, NH (US)

(73) Assignee: Allegro MicroSystems, LLC, Manchester, NH (US)

(*) Notice: Subject to any disclaimer, the term of this patent is extended or adjusted under 35 U.S.C. 154(b) by 95 days.

(21) Appl. No.: 15/350,400

(22) Filed: Nov. 14, 2016

(65) Prior Publication Data

US 2018/0136999 A1 May 17, 2018

(51) Int. Cl.
| | |
|---|---|
| *G06F 11/00* | (2006.01) |
| *G06F 11/07* | (2006.01) |
| *G01R 33/00* | (2006.01) |
| *G01R 33/06* | (2006.01) |
| *G01R 33/07* | (2006.01) |
| *G01R 31/28* | (2006.01) |
| *G01R 31/44* | (2006.01) |
| *B60R 16/023* | (2006.01) |

(52) U.S. Cl.
CPC ...... *G06F 11/0739* (2013.01); *G01R 31/2829* (2013.01); *G01R 31/44* (2013.01); *G01R 33/0023* (2013.01); *G01R 33/0029* (2013.01); *G01R 33/0041* (2013.01); *G01R 33/06* (2013.01); *G01R 33/072* (2013.01); *G06F 11/0754* (2013.01); *G06F 11/0772* (2013.01); *B60R 16/0232* (2013.01); *B60Y 2400/303* (2013.01); *B60Y 2400/3032* (2013.01)

(58) Field of Classification Search
USPC .......................................... 714/6.13, 10, 48
See application file for complete search history.

(56) References Cited

U.S. PATENT DOCUMENTS

| | | |
|---|---|---|
| 6,288,567 B1 | 9/2001 | Fink |
| 6,542,847 B1 | 4/2003 | Lohberg et al. |
| 6,687,644 B1 | 2/2004 | Zinke et al. |

(Continued)

FOREIGN PATENT DOCUMENTS

| | | |
|---|---|---|
| DE | 19650935 A1 | 6/1998 |
| DE | 19911774 A1 | 12/1999 |

(Continued)

OTHER PUBLICATIONS

U.S. Appl. No. 14/918,716, filed Oct. 21, 2015, Latham et al.

(Continued)

*Primary Examiner* — Sarai E Butler
(74) *Attorney, Agent, or Firm* — Daly, Crowley, Mofford & Durkee LLP

(57) ABSTRACT

Described embodiments provide circuits, systems and methods for detecting and communicating fault conditions. In an embodiment, an integrated circuit includes a fault detector to detect a fault condition of the integrated circuit and a controller to generate output data of the integrated circuit. An output generator generates an output signal of the integrated circuit. The output signal is generated at a first set of output levels based upon the output data when the fault detector does not detect the fault condition, and the output signal is generated at a second set of output levels based upon the output data when the fault detector detects the fault condition.

41 Claims, 8 Drawing Sheets

(56) References Cited

U.S. PATENT DOCUMENTS

| | | |
|---|---|---|
| 6,815,944 B2 | 11/2004 | Vig et al. |
| 6,968,484 B2 | 11/2005 | Hummel |
| 7,026,808 B2 | 4/2006 | Vig et al. |
| 7,319,418 B2 | 1/2008 | Fink |
| 8,577,634 B2 | 11/2013 | Donovan et al. |
| 8,624,588 B2 | 1/2014 | Vig et al. |
| 8,754,640 B2 | 6/2014 | Vig et al. |
| 8,860,404 B2 | 10/2014 | Dwyer et al. |
| 8,994,369 B2 | 3/2015 | Vig et al. |
| 9,068,859 B2 | 6/2015 | Dwyer et al. |
| 9,151,771 B2 | 10/2015 | Vig et al. |
| 9,172,565 B2 | 10/2015 | Cadugan et al. |
| 9,222,990 B2 | 12/2015 | Dwyer et al. |
| 9,300,235 B2 | 3/2016 | Ng et al. |
| 2003/0141862 A1 | 7/2003 | Vig et al. |
| 2010/0026279 A1 | 2/2010 | Vig et al. |
| 2010/0211347 A1 | 8/2010 | Friedrich et al. |
| 2013/0335069 A1 | 12/2013 | Vig et al. |
| 2013/0335074 A1 | 12/2013 | Dwyer et al. |
| 2014/0375312 A1 | 12/2014 | Friedrich et al. |
| 2015/0185279 A1 | 7/2015 | Milano et al. |
| 2015/0236746 A1 | 8/2015 | Scheinkerman et al. |
| 2015/0236869 A1 | 8/2015 | Vreeland et al. |
| 2016/0025820 A1* | 1/2016 | Scheller .................... G01P 3/44 324/207.25 |
| 2016/0123780 A1 | 5/2016 | Snyder et al. |
| 2016/0139230 A1 | 5/2016 | Petrie et al. |

FOREIGN PATENT DOCUMENTS

| | | |
|---|---|---|
| DE | 19634714 B4 | 8/2007 |
| EP | 0944888 B1 | 10/2001 |
| JP | 2001/505691 A | 4/2001 |
| JP | 4142109 B2 | 8/2008 |
| WO | WO 9825148 A2 | 6/1998 |
| WO | WO 2010/150416 | 12/2010 |

OTHER PUBLICATIONS

U.S. Appl. No. 15/010,434, filed Jan. 29, 2016, Prentice et al.
U.S. Appl. No. 62/337,478, filed May 17, 2016, Burdette et al.
PCT International Search Report and Written Opinion dated Mar. 8, 2018 for International Application No. PCT/US2017/059148; 16 pages.

* cited by examiner

DIAGNOSTIC FAULT COMMUNICATION

BACKGROUND

Sensors can be used in various types of devices to measure and monitor properties of systems in a wide variety of different applications. For example, sensors have become common in products that rely on electronics in their operation, such as automobile control systems. Common examples of automotive applications for sensors are the detection of ignition timing from a position or rotation of an engine crankshaft and/or camshaft, the detection of wheel speed for anti-lock braking systems and four-wheel steering systems, and other applications.

Many automotive sensors use serial communication to send data in the form of a stream of pulses or bits over a communication channel to a computer or other processing system. Typically, each pulse stream conveys a limited amount of data, and may not efficiently or accurately, if at all, report fault conditions of the sensor.

SUMMARY

This Summary is provided to introduce a selection of concepts in a simplified form that are further described in the Detailed Description. This Summary is not intended to identify key features or essential features of the claimed subject matter, nor is it intended to be used to limit the scope of the claimed subject matter.

One aspect provides an integrated circuit includes a fault detector to detect a fault condition of the integrated circuit and a controller to generate output data of the integrated circuit. An output generator generates an output signal of the integrated circuit. The output signal is generated at a first set of output levels based upon the output data when the fault detector does not detect the fault condition, and the output signal is generated at a second set of output levels based upon the output data when the fault detector detects the fault condition.

Another aspect provides a sensor including at least one magnetic field sensing element to generate a magnetic field signal indicative of a magnetic field sensed by the at least one magnetic field sensing element. An analog-to-digital converter (ADC) generates a digital magnetic field value associated with the magnetic field signal. A controller receives the digital magnetic field value and generates a sensed speed signal. The controller detects diagnostic faults of the sensor and generates a fault output signal based upon the detected diagnostic faults. An output generator generates a sensor output signal. The output generator receives the sensed speed signal and the fault output signal. The sensor output signal is generated at a first set of output levels based upon the sensed speed signal and a first value of the fault output signal, and the sensor output signal is generated at a second set of output levels based upon the sensed speed signal and a second value of the fault output signal.

Another aspect provides a method for communicating fault conditions of an integrated circuit. The method includes detecting, by a fault detector, a fault condition of the integrated circuit. A controller generates output data of the integrated circuit. An output generator generates an output signal of the integrated circuit at a first set of output levels based upon the output data when the fault detector does not detect the fault condition. The output generator generates the output signal at a second set of output levels based upon the output data when the fault detector detects a fault condition.

Another aspect provides a method for operating a vehicular sensor. The method includes generating a magnetic field signal indicative of a sensed magnetic field by a magnetic field sensing element of the vehicular sensor. An analog-to-digital converter (ADC) of the vehicular sensor generates a digital magnetic field value associated with the magnetic field signal. A controller of the vehicular sensor receives the digital magnetic field value and generates a sensed speed signal. Diagnostic faults of the vehicular sensor are detected, and the controller generates a fault output signal based upon the detected diagnostic faults. An output generator of the vehicular sensor receives the sensed speed signal and the fault output signal. The output generator generates a sensor output signal at a first set of output levels based upon the sensed speed signal and a first value of the fault output signal. The output generator generates the sensor output signal at a second set of output levels based upon the sensed speed signal and a second value of the fault output signal.

BRIEF DESCRIPTION OF THE DRAWING FIGURES

Other aspects, features, and advantages of the claimed subject matter will become more fully apparent from the following detailed description, the appended claims, and the accompanying drawings in which like reference numerals identify similar or identical elements. Reference numerals that are introduced in the specification in association with a drawing figure might be repeated in one or more subsequent figures without additional description in the specification in order to provide context for other features.

DETAILED DESCRIPTION

Described embodiments provide circuits, systems and methods for detecting and communicating fault conditions. In an embodiment, an integrated circuit includes a fault detector to detect a fault condition of the integrated circuit and a controller to generate output data of the integrated circuit. An output generator generates an output signal of the integrated circuit. The output signal is generated at a first set of output levels based upon the output data when the fault detector does not detect the fault condition, and the output signal is generated at a second set of output levels based upon the output data when the fault detector detects the fault condition.

Figure 1:
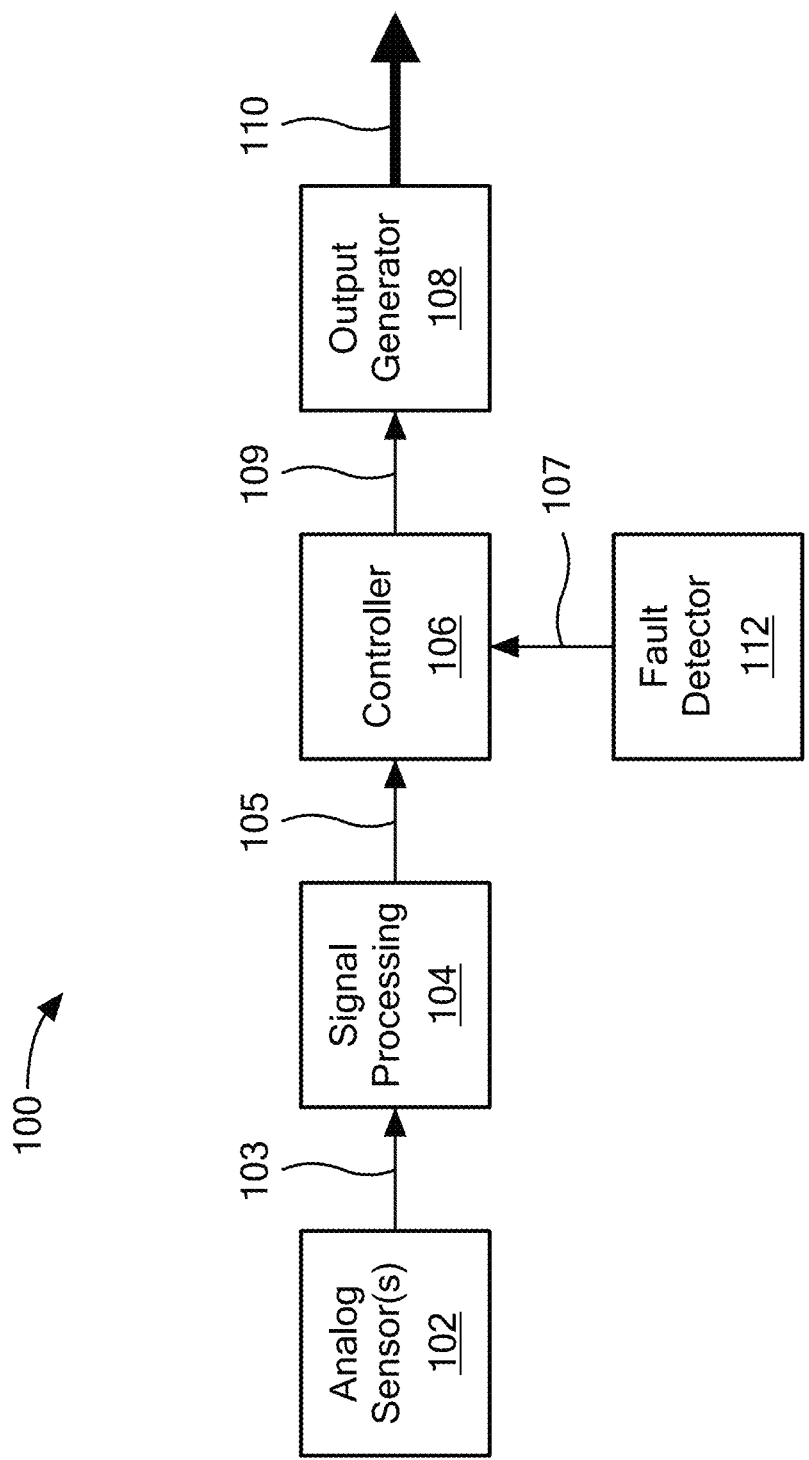
FIG. 1 is a block diagram showing a sensor system with a fault detector, in accordance with illustrative embodiments.

Referring to FIG. 1, a block diagram of an illustrative sensor system 100 is shown. Sensor system 100 may be located proximate to an environment or element of interest (generally, "target"), for which sensor data is desired to be sensed. Sensor system 100 may generally be capable of providing information about a target and/or the sensor system itself using a formatted output signal. Described embodiments of sensor system 100 may generally be employed in vehicular or automotive environments, although sensor system 100 may be employed in other environments. Detecting and communicating faults in sensor system 100 can be particularly important when sensor system 100 is deployed in a vehicle, for example for automotive safety related applications requiring conformity to Automotive Safety Integrity Level (ASIL).

In embodiments where sensor system 100 is deployed in a vehicle, sensor system 100 may be employed to monitor operating parameters such as current, speed, angle, linear position, rotational direction, temperature, etc. of an article associated with a control module, such as a power steering module, a fuel injection module, an anti-lock brake module, etc. The sensor output signals may be provided over a communication bus to a system controller, such as an Electronic/Engine Control Unit (ECU) or Engine Control Module (ECM), which processes data provided by the various sensors.

As shown in FIG. 1, sensor system 100 may include one or more analog sensors 102, which provide associated sensor signals 103 to signal processing block 104. For example, analog sensors 102 may include one or more sensors to determine conditions related to the sensor system. For example, analog sensors 102 may include one or more magnetic field sensors to sense the position and/or movement of a ferromagnetic target object (not shown). Other sensors may additionally or alternatively be employed, for example temperature sensors, humidity sensors, light (or optical) sensors, accelerometers, gyroscopes, pressure sensors, gas sensors, bolometers, sound sensors, or other sensors. In some embodiments, sensor system 100 may be implemented in an integrated circuit (IC). Signal processing block 104 is described in greater detail in regard to FIG. 2.

Signal processing block 104 provides one or more data signals 105 to controller 106. Controller 106 is in communication with fault detector 112, which provides one or more fault indicator signals 107 to controller 106. Based, at least in part, upon data signals 105 and fault indicator signals 107, controller 106 provides one or more output data signals 109 to output generator 108. Output generator 108 generates output signal 110. Output signal 110 may be communicated to one or more remote devices (not shown) coupled to sensor system 100. In embodiments where sensor system 100 is deployed in a vehicle, output signal 110 may be communicated for further processing to an ECU or ECM of the vehicle.

In some embodiments, output generator 108 may generate output signal 110 as a signal pulse train that includes multiple pulses. The pulses may be generated in response to sensor signals 103 generated by sensor(s) 102. Each pulse may have one or more different characteristics including, but not limited to, different amplitudes and pulse widths. The different characteristics (e.g., position, amplitude, width) of each of the pulses may be used to provide a variety of information related to the target and/or the sensor system itself. For example, output signal 110 may communicate data (e.g., data bits or data words) about the outputs of sensors 102 or a state of sensor system 100.

In other embodiments, output generator 108 may generate output signal 110 in accordance with one of a variety of formats, for example a pulse-width modulated (PWM) signal format, a Single Edge Nibble Transmission (SENT) format, a Serial Peripheral Interface (SPI) format, a Local Interconnect Network (LIN) format, a CAN (Controller Area Network) format, an Inter-Integrated Circuit (I2C) format, or other similar signal formats.

In embodiments where output signal 110 is a signal pulse train, the pulse widths may be indicative of one or more data bits used to form data words. In some embodiments, the pulse train may include delimiting pulses that define portions of the signal pulse train. For example, delimiting pulses may indicate that a series of pulses between delimiting pulses may be considered together to convey information (e.g., as a data word, etc.). In an embodiment, delimiting pulses may be distinguished from non-delimiting pulses by a pulse characteristic (e.g., a pulse width, etc.).

In some embodiments, sensor(s) 102 may include sensors that are similar to the types described in each of U.S. Pat. No. 6,815,944, filed on Oct. 29, 2002, U.S. Pat. No. 7,026,808, filed on Sep. 23, 2004, U.S. Pat. No. 8,624,588, filed on Jul. 31, 2008, U.S. Pat. No. 9,151,771, filed on Dec. 2, 2013, U.S. Pat. No. 8,994,369, filed on Dec. 2, 2013, and U.S. Pat. No. 8,754,640, filed on Jun. 18, 2012, all of which are incorporated herein by reference in their entireties.

Figure 2:
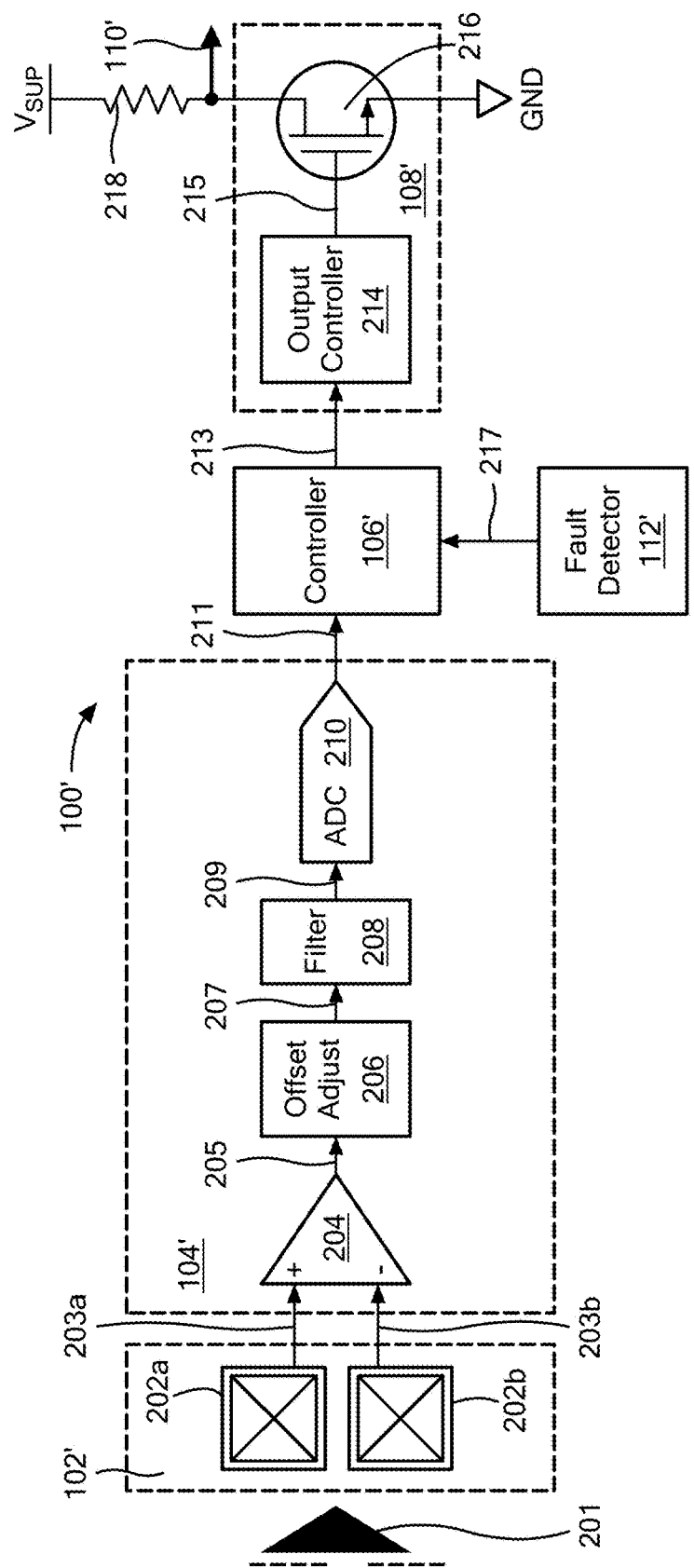
FIG. 2 is a schematic diagram of the sensor system of FIG. 1, in accordance with illustrative embodiments.

Referring to FIG. 2, additional detail of an illustrative embodiment of sensor system 100 is shown as sensor system 100'. As shown in FIG. 2, in some embodiments, sensor system 100' may be employed as a magnetic field sensor, for example to detect variations in a sensed magnetic field due to characteristics and/or mechanical features of a ferromagnetic target (not shown), for example to detect, motion, speed, rotation, and/or position of the target. For example, such a magnetic field sensor may include one or more magnetic field sensing elements.

As used herein, the term "magnetic field sensor" describes a circuit that uses one or more magnetic field sensing elements to detect variations in a magnetic field. Magnetic field sensors are used in a variety of applications, including, but not limited to, sensing an angle of a direction of a magnetic field, sensing a magnetic field generated by a current carried by a conductor, sensing the proximity, movement or rotation of a ferromagnetic object, etc. As used herein, the term "magnetic field sensing element" describes electronic elements that can sense a magnetic field. The magnetic field sensing element can be, but is not limited to, a Hall effect element, a magnetoresistance element, or a magnetotransistor. There are different types of Hall effect elements, for example, a planar Hall element, a vertical Hall element, and a Circular Vertical Hall (CVH) element. There are also different types of magnetoresistance elements, for example, a semiconductor magnetoresistance element such as Indium-Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element might be a single element or, alternatively, might include two or more magnetic field sensing elements arranged in various configurations, (e.g., a half bridge or full bridge). Depending on the device type and other application requirements, the magnetic field sensing element might be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

Referring to FIG. 2, illustrative sensor system 100' may include or be coupled to one or more magnetic field sensing elements 202a and 202b. Magnetic field sensing elements 202a and 202b may experience a magnetic field 201. In some embodiments, magnetic field 201 may be generated by a back bias magnet (not shown) and is influenced by a ferromagnetic target (not shown) such that magnetic field sensing elements 202a and 202b experience different magnitudes of magnetic fields as the target moves.

Signals 203a and 203b from magnetic field sensing elements 202a and 202b, respectively, are provided to signal processing block 104'. As shown in FIG. 2, signal processing block 104' may include differential amplifier 204, offset adjustment circuit 206, filter 208 and A/D converter (or ADC) 210.

Signals 203a and 203b are received by differential amplifier 204. In some embodiments, adjustments might be made to operating parameters of differential amplifier 204 during a calibration period of sensor system 100'. For example, differential amplifier 204 might include input range and coarse sensitivity adjustments. Differential amplifier 204 generates difference signal 205, which might be received by coarse offset voltage adjustment circuit 206. Coarse offset adjustment circuit 206 generates offset adjusted signal 207, for example, that is within an operational range of N-bit analog-to-digital (A/D) converter 210. Filter 208 may optionally filter undesired signal components from offset adjusted signal 207 and provide filtered signal 209 to A/D converter 210. A/D converter 210 generates digital signal 211, which is provided to controller 106'. Digital signal 211 is a digital value representative of the magnetic field sensed by magnetic field sensing elements 202a and 202b. In an embodiment, A/D converter 210 may be a data slicer (e.g., N=1) to generate digital signal 211 as a single bit digital signal.

In some embodiments, signal processing block 104' may further process signals 203a and 203b, for example to provide bandwidth and temperature compensation, linearization and/or clamping. For embodiments in which magnetic field sensing elements 202a and 202b are Hall effect elements, signal processing block 104' may chop (or current spin) the Hall effect elements to reduce apparent offset voltages of Hall elements 202a and 202b.

Controller 106' receives digital signal 211. Controller 106' may also receive fault signals 217 from fault detector 112'. Fault detector 112' may generally detect error conditions of sensor system 100' and communicate fault condition(s) to controller 106' via fault signals 217. In some embodiments, fault detector 112' may detect error conditions of sensor system 100'. For example, fault detector 112' may detect when output levels of Hall elements 202a and 202b are outside of an expected or valid range. For example, in a system employing a back bias magnet, Hall elements 202a and 202b are expected to always sense a non-zero magnetic field. If either Hall element were to indicate a sensed magnetic field of zero, this condition could indicate that one of the Hall elements is broken, that the back bias magnet has been removed, or some other error condition. Similarly, fault detector 112' may additionally or alternatively detect faults of sensor system 100', such as a specific sensed value indicating an error condition (e.g., an over- or under-voltage condition of a specific signal, an over- or under-current condition of a specific signal, a temperature or other sensed value being outside of an anticipated range, etc.). In some embodiments, fault detector 112' may be in communication with a microcontroller (e.g., controller 106) which may also indicate additional errors (e.g., errors with processed data, memory errors, clock errors, etc.).

In some embodiments, based upon digital signal 211 and fault signals 217, controller 106' provides output data signal 213 to output generator 108'. In other embodiments, digital signal 211 and fault signals 217 may be provided to output generator 108'.

As shown in FIG. 2, output generator 108' may include output controller 214, which controls output transistor 216 via output control signal 215. In some embodiments, fault detector 112' may also provide fault signals 217 to output controller 214. In the illustrative embodiment shown in FIG. 2, output transistor 216 operates to allow output signal 110' to charge from supply voltage $V_{SUP}$ through resistor 218 (e.g., when output transistor 216 is off) to achieve a logic-high voltage level (e.g., approximately $V_{SUP}$), or to discharge output signal 110' to GND (e.g., when output transistor 216 is on) to achieve a logic-low voltage level (e.g., approximately GND). Thus, output controller 214 controls output transistor 216 to achieve desired logic-levels of pulses of output signal 110'. Output signal 110' might be communicated to an Electronic/Engine Control Unit (ECU) or Engine Control Module (ECM) or similar controller of an automotive system.

In the illustrative embodiment shown in FIG. 2, when output transistor 216 is an N-channel FET, output control signal 215 is provided to the gate node of transistor 216, the source node of output transistor 216 is coupled to GND, and the drain node of output transistor 216 is coupled to output signal 110'. A first node of resistor 218 is coupled to output signal 110', and the second node of resistor 218 is coupled to supply voltage $V_{SUP}$.

Although shown in FIG. 2 as being implemented as an N-channel field effect transistor (FET), output transistor 216 could alternatively be implemented as a P-channel FET, an N- or P-type bipolar junction transistor (BJT), other types of semiconductor switching elements (e.g., triacs, thyristors, silicon controlled rectifiers (SCRs), etc.), or a mechanical switch or relay. Similarly, although shown in FIG. 2 as being pulled-up by resistor 218 and discharged by output transistor 216, output signal 110' could alternatively be pulled-down by a resistor and charged by output transistor 216. Further, other embodiments may employ a push-pull arrangement.

In embodiments of sensor system 100' that are employed in automotive settings, sensor system 100' might be implemented as a so-called "three-wire" speed sensor, because sensor system 100' is connected to a high (or positive) supply voltage (e.g., $V_{SUP}$), a low (or negative) supply voltage (e.g., GND), and a signal output (e.g., to communicate output signal 110'). As shown in the illustrative embodiment of FIG. 2, output signal 110' may be driven by an open drain output transistor circuit (e.g., output controller 214 and output transistor 216) that generates output signal 110' and also detects open circuit and/or short circuit conditions of the signal output wire (e.g., the wire coupled to output signal 110').

As will be described, the open or short circuit conditions may be detected due to output controller 214 controlling the current and/or voltage of output control signal 215 in order to control the saturation level of output transistor 216. By controlling the saturation level of output transistor 216, described embodiments may typically (e.g., when a fault condition has not been detected) communicate output signal 110' at a high logic level that is less than the high (or positive) supply voltage (e.g., $V_{SUP}$), and a low logic level that is greater than the low (or negative) supply voltage (e.g., GND). If a short circuit or open circuit occurs on the signal output, output signal 110' might become substantially equal to the high (or positive) supply voltage (e.g., $V_{SUP}$), or the low (or negative) supply voltage (e.g., GND), and, thus, output signal 110' would be at voltage levels outside the expected voltage range (e.g., out-of-bounds (OOB) logic levels), allowing a short or open circuit fault to be detected by a receiver (not shown) coupled to output signal 110'. As will be described, some embodiments of sensor system 100 may generate output signal 110' at the OOB logic levels to communicate fault conditions of sensor system 100 to a receiver coupled to output signal 110'.

Figure 3:
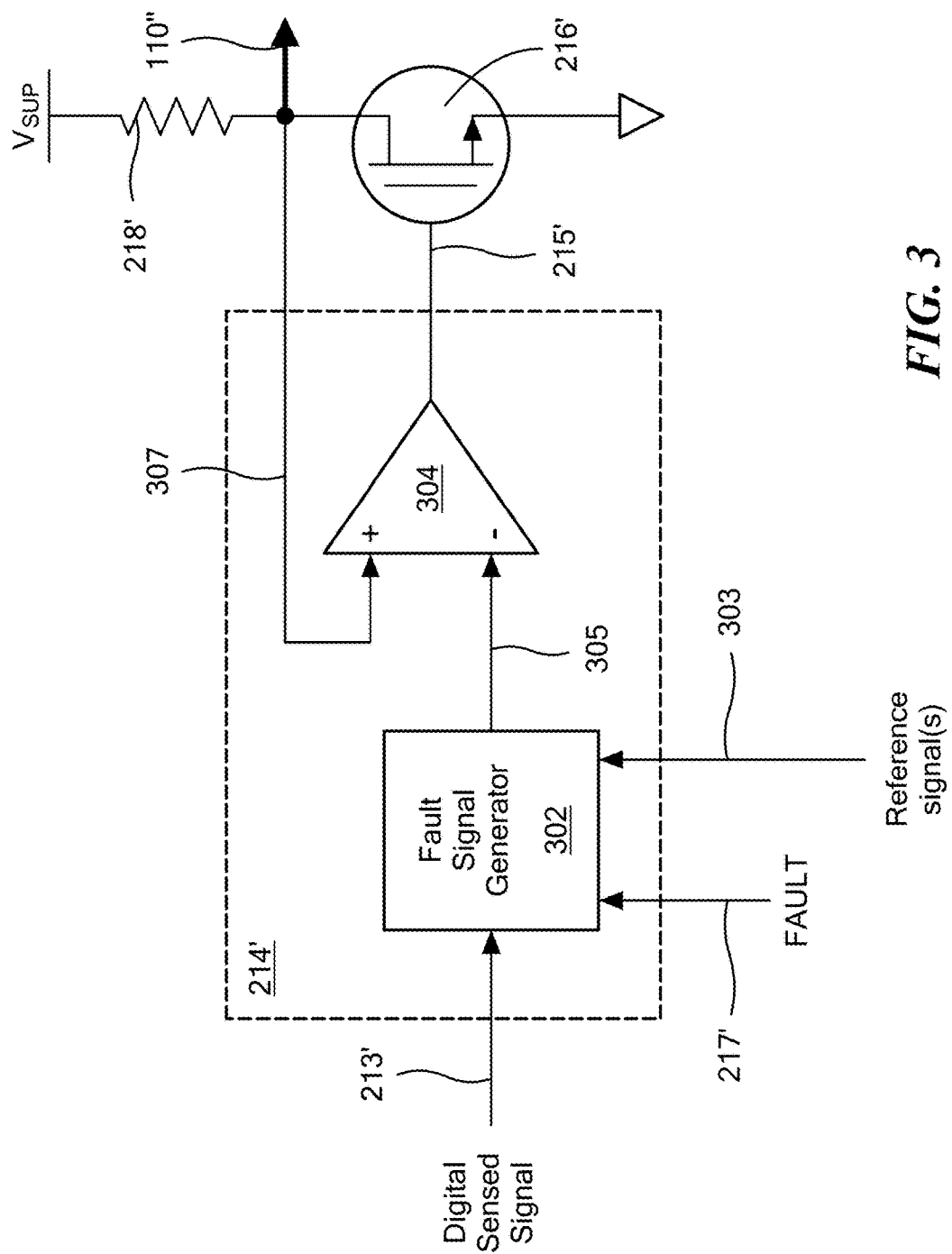
FIG. 3 is a schematic diagram of an output generator of the sensor system of FIG. 1, in accordance with illustrative embodiments.

Referring to FIG. 3, additional detail of an illustrative embodiment of output controller 214 is shown. As shown in FIG. 3, illustrative output controller 214' includes fault signal generator 302 and operational amplifier 304. Output controller 214' and fault signal generator 302 receive signal 213' from controller 106 (some embodiments may alternatively receive digital signal 211' from signal processing block 104). As described herein, digital signals 211' and 213' are indicative of the sensor data from sensors 102. Fault signal generator 302 also receives fault signals 217', for example from fault detector 112. Fault signal generator 302 also receives one or more reference signals 303. Based upon digital signal 213', fault signals 217' and reference signal(s) 303, fault signal generator 302 generates fault output signal 305, which is provided as an input signal to operational amplifier 304.

As shown in FIG. 3, in some embodiments, fault output signal 305 is provided as a negative or inverting input to operational amplifier 304. Operational amplifier 304 may receive feedback signal 307, which is coupled to output signal 110". As shown in FIG. 3, in some embodiments, feedback signal 307 is provided as a positive or non-inverting input to operational amplifier 304. Operational amplifier 304 generates output control signal 215', which is provided to the gate node of output transistor 216'. Operational amplifier 304 operates to control the operation mode of output transistor 216' and, therefore, the voltage levels presented as output signal 110".

As described herein, operational amplifier 304 may control the current and/or voltage of output control signal 215' in order to control the saturation level of output transistor 216'. By controlling the saturation level of output transistor 216', described embodiments may typically communicate output signal 110' at a high logic level that is less than the high (or positive) supply voltage (e.g., $V_{SUP}$), and a low logic level that is greater than the low (or negative) supply voltage (e.g., GND). If an error or fault condition of sensor system 100 is detected, output transistor 216' may generate output signal 110" at OOB logic levels where a fault logic high level is greater than the high logic level (e.g., approximately equal to $V_{SUP}$) and a fault logic low level is less than the low logic level (e.g., approximately equal to GND) in order to communicate fault conditions of sensor system 100 to a receiver coupled to output signal 110".

Figure 4:
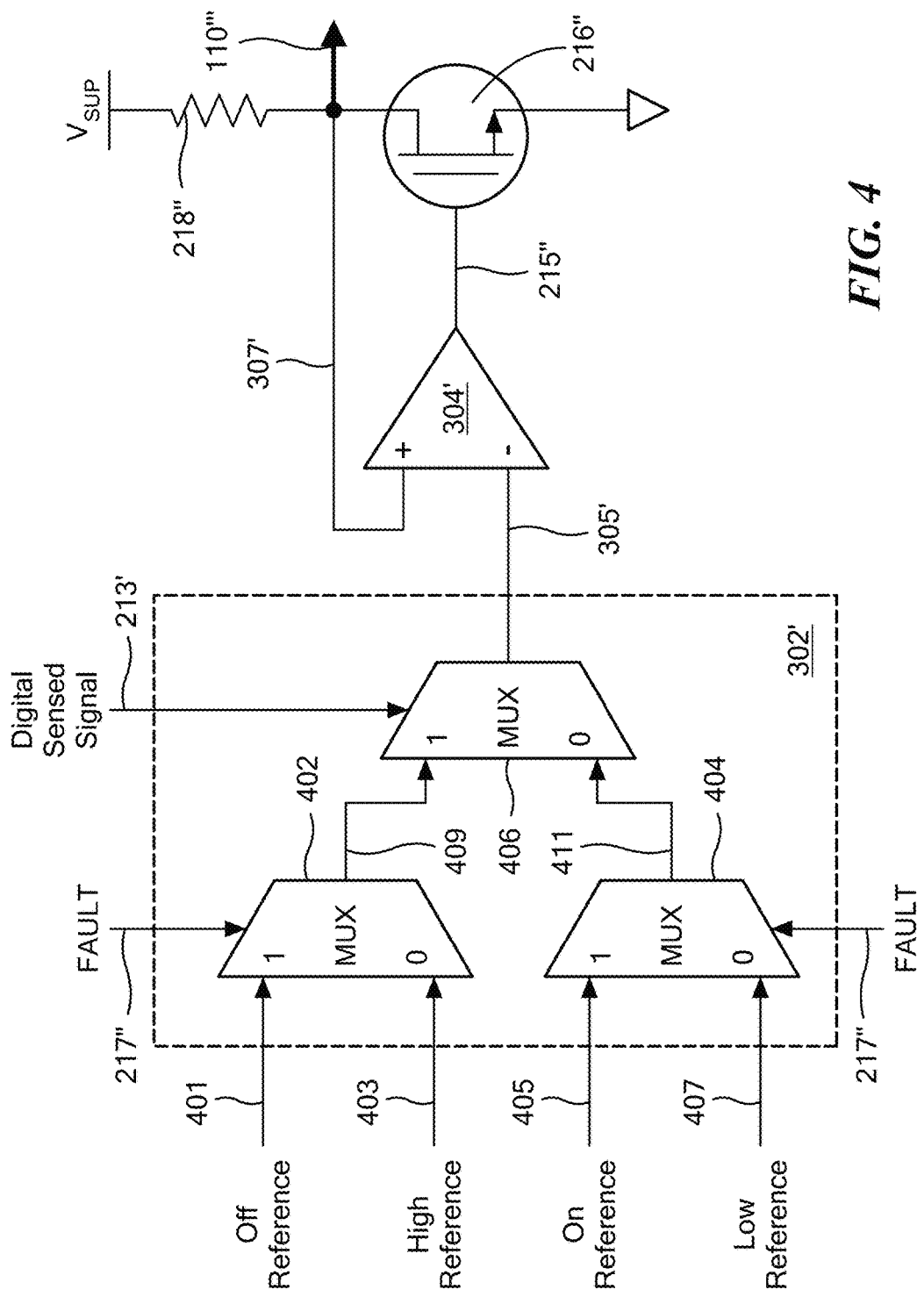
FIG. 4 is a schematic diagram of a fault signal generator of the output generator of FIG. 4, in accordance with illustrative embodiments.

Referring to FIG. 4, additional detail of an illustrative embodiment of fault signal generator 302 is shown as fault signal generator 302'. Fault generator 302' may include one or more multiplexers (muxes), shown as muxes 402, 404 and 406. In the illustrative embodiment shown in FIG. 4, mux 402 receives reference signal 401 and reference signal 403. As shown, reference signal 401 may be an "off reference" signal that is associated with turning off output transistor 216" such that output signal 110''' is at an OOB logic high level (e.g., approximately equal to $V_{SUP}$), and reference signal 403 may be a "high reference" signal that is associated with setting output transistor 216" such that output signal 110''' is at a logic high output level that is less than the OOB logic high level. Mux 402 selects between off reference signal 401 and high reference signal 403 based upon fault signal 217" to generate high output signal 409.

Similarly, mux 404 receives reference signal 405 and reference signal 407. As shown, reference signal 405 may be an "on reference" signal that is associated with turning on output transistor 216" such that output signal 110''' is at an OOB logic low level (e.g., approximately equal to GND), and reference signal 407 may be a "low reference" signal that is associated with setting output transistor 216" such that output signal 110''' is at a logic low output level that is less than the logic high level but greater than the OOB logic low level. Mux 404 selects between on reference signal 405 and low reference signal 407 based upon fault signal 217" to generate low output signal 411. High output signal 409 and low output signal 411 are provided to mux 406.

Mux 406 selects between high output signal 409 and low output signal 411 based upon digital signal 213' from controller 106. Thus, mux 406 selects between high output signal 409 and low output signal 411 based upon the digital value(s) to be communicated as output signal 110'''. The output of mux 406 is provided as fault output signal 305', which is provided as the inverting input to operational amplifier 304'. As shown in the illustrative embodiment of FIG. 4, operational amplifier 304' may receive a feedback signal 307' (e.g., of output signal 110''') to its non-inverting input. In such embodiments, operational amplifier 304' is implemented as a comparator having a reference input (e.g., fault output signal 305') set based upon whether a fault is detected (e.g., fault signal 217") and the digital value to be communicated as output signal 110''' (e.g., digital signal 213').

Thus, as shown in FIG. 4, output signal 110''' may be generated based upon one or more of reference signals 401, 403, 405 and 407, and the one or more fault indicator signals 217". For example, if fault detector 112 detects a fault condition of sensor system 100, fault signal 217" may be set (e.g., logic high) such that mux 402 and mux 404 select off reference signal 401 and on reference signal 405 as high output signal 409 and low output signal 411, respectively. Mux 406 then selects between high output signal 409 and low output signal 411 based upon digital signal 213' (e.g., if digital signal 213' is logic high, mux 406 selects high output signal 409 as fault output signal 305', and if digital signal 213' is logic low, mux 406 selects low output signal 411 as fault output signal 305').

Similarly, if fault detector 112 does not detect a fault condition of sensor system 100, fault signal 217" may be clear (e.g., logic low) such that mux 402 and mux 404 select high reference signal 403 and low reference signal 407 as high output signal 409 and low output signal 411, respectively. Mux 406 then selects between high output signal 409 and low output signal 411 based upon digital signal 213' (e.g., if digital signal 213' is logic high, mux 406 selects high output signal 409 as fault output signal 305', and if digital signal 213' is logic low, mux 406 selects low output signal 411 as fault output signal 305').

Based upon the value of fault output signal 305', operational amplifier 304' sets output control signal 215" to drive a saturation level of output transistor 216". For example, when fault output signal 305' is set to on reference signal 405 (e.g., a fault is detected and digital signal 213' is logic low), operational amplifier 304' sets output control signal 215" to turn on output transistor 216" in complete saturation such that output signal 110''' is set to as low a value as possible (e.g., approximately GND), and output signal 110''' is thus at the OOB logic low level to communicate a fault condition (and data) to a receiver of output signal 110'''. When fault output signal 305' is set to off reference signal 401 (e.g., a fault is detected and digital signal 213' is logic high), operational amplifier 304' sets output control signal 215" to turn off output transistor 216" entirely such that output signal 110''' is set to as high a value as possible (e.g., approximately $V_{SUP}$), and output signal 110''' is thus at the OOB logic high level to communicate a fault condition (and data) to a receiver of output signal 110'''.

Similarly, when fault output signal 305' is set to low reference signal 407 (e.g., a fault is not detected and digital signal 213' is logic low), operational amplifier 304' sets output control signal 215" to turn on output transistor 216" to less than complete saturation such that output signal 110''' is set to a value greater than GND, and output signal 110''' is thus at the logic low level to communicate data to a receiver of output signal 110'''. When fault output signal 305' is set to high reference signal 403 (e.g., a fault is not detected and digital signal 213' is logic high), operational amplifier 304' sets output control signal 215" to partially turn off output transistor 216" such that output transistor 216" is still conducting, such that output signal 110''' is set to a value less than $V_{SUP}$, and output signal 110''' is thus at the logic high level to communicate data to a receiver of output signal 110'''.

Figure 5:
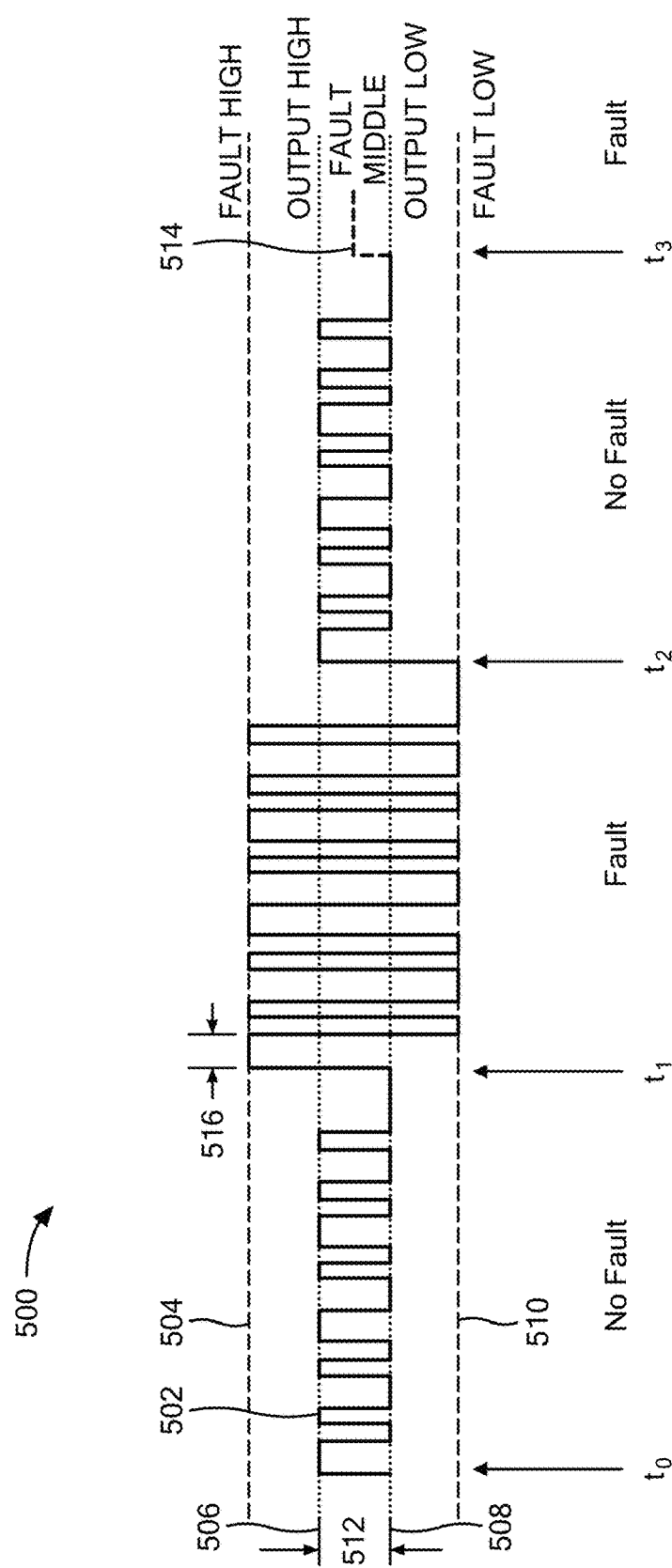
FIG. 5 is a timing diagram showing an illustrative output signal of the output generator of FIG. 3, in accordance with illustrative embodiments.

Referring to FIG. 5, an illustrative timing diagram of output signal 110 is shown as pulse train signal 502. As shown, pulse train signal 502 includes a plurality of pulses. Although FIG. 5 is not to scale, in some embodiments, the pulses may have differing pulse widths (e.g., 516) to convey information. As shown in FIG. 5, between time to and time $t_1$, no fault condition is detected (e.g., by fault detector 112). As described in regard to FIG. 4, when no fault condition is detected, fault signal 217" may be clear (e.g., logic low). When fault signal 217" is clear, mux 402 selects high reference 403 and mux 404 selects low reference 407. Thus, when fault signal 217" is clear, mux 406 selects between high reference 403 and low reference 407 based upon the value of digital signal 213'. As shown in FIG. 5, between time to and time when no fault is detected, output signal 110 is switched between an output high logic level 506 and an output low logic level 508.

However, between time $t_1$ and time $t_2$, a fault condition is detected (e.g., by fault detector 112). As described in regard to FIG. 4, when a fault condition is detected, fault signal 217" may be set (e.g., logic high). When fault signal 217" is set, mux 402 selects off reference 401 and mux 404 selects on reference 405. Thus, when fault signal 217" is set, mux 406 selects between off reference 401 and on reference 405 based upon the value of digital signal 213'. As shown in FIG. 5, between time $t_1$ and time $t_2$, when a fault is detected, output signal 110 is switched between a fault high logic level 504 and a fault low logic level 510.

Although FIG. 5 is not to scale, as described herein and as shown in FIG. 5, fault high logic level 504 is greater than output high logic level 506, which is greater than output low logic level 508, which is greater than fault low logic level 510. As described herein, fault high logic level 504 may be approximately $V_{SUP}$, and fault low logic level 510 may be approximately GND. As shown in FIG. 5, output high logic level 506 and output low logic level 508 may be separated by voltage range 512. In some embodiments, an intermediate voltage within voltage range 512 may also be employed to communicate a specific fault condition. Such an intermediate voltage is shown in FIG. 5 as fault middle logic level 514. In embodiments employing such an intermediate fault logic level, fault signal generator 302 (e.g., as shown in FIG. 4) may employ one or more additional multiplexers, a multiplexer having an additional input, or other similar techniques to select an intermediate reference signal so as to enable output transistor 216" to generate the intermediate voltage.

In some embodiments, once fault detector 112 detects a fault condition (e.g., at time $t_1$ of FIG. 5), sensor system 100 may continue to communicate at the OOB logic levels (e.g., fault high logic level 504 and fault low logic level 510) until sensor system 100 is reset, even if the detected fault condition was resolved. In other embodiments, sensor system 100 may communicate at the OOB logic levels (e.g., fault high logic level 504 and fault low logic level 510) while a fault condition is detected, but return to communicate at the in-bounds logic levels (e.g., output high logic level 506 and output low logic level 508) once the fault condition is resolved, such as shown at time $t_2$ in FIG. 5.

As shown in FIG. 5, at time $t_3$, some embodiments of sensor system 100 may optionally set output signal 110''' at fault middle logic level 514. Fault middle logic level 514 may be optionally employed to communicate a specific fault, for example a fault of sensor system 100 where it would not be useful to continue to communicate sensor data to a receiver of output signal 110''' (e.g., when the sensor data is known to be incorrect).

Figure 6:
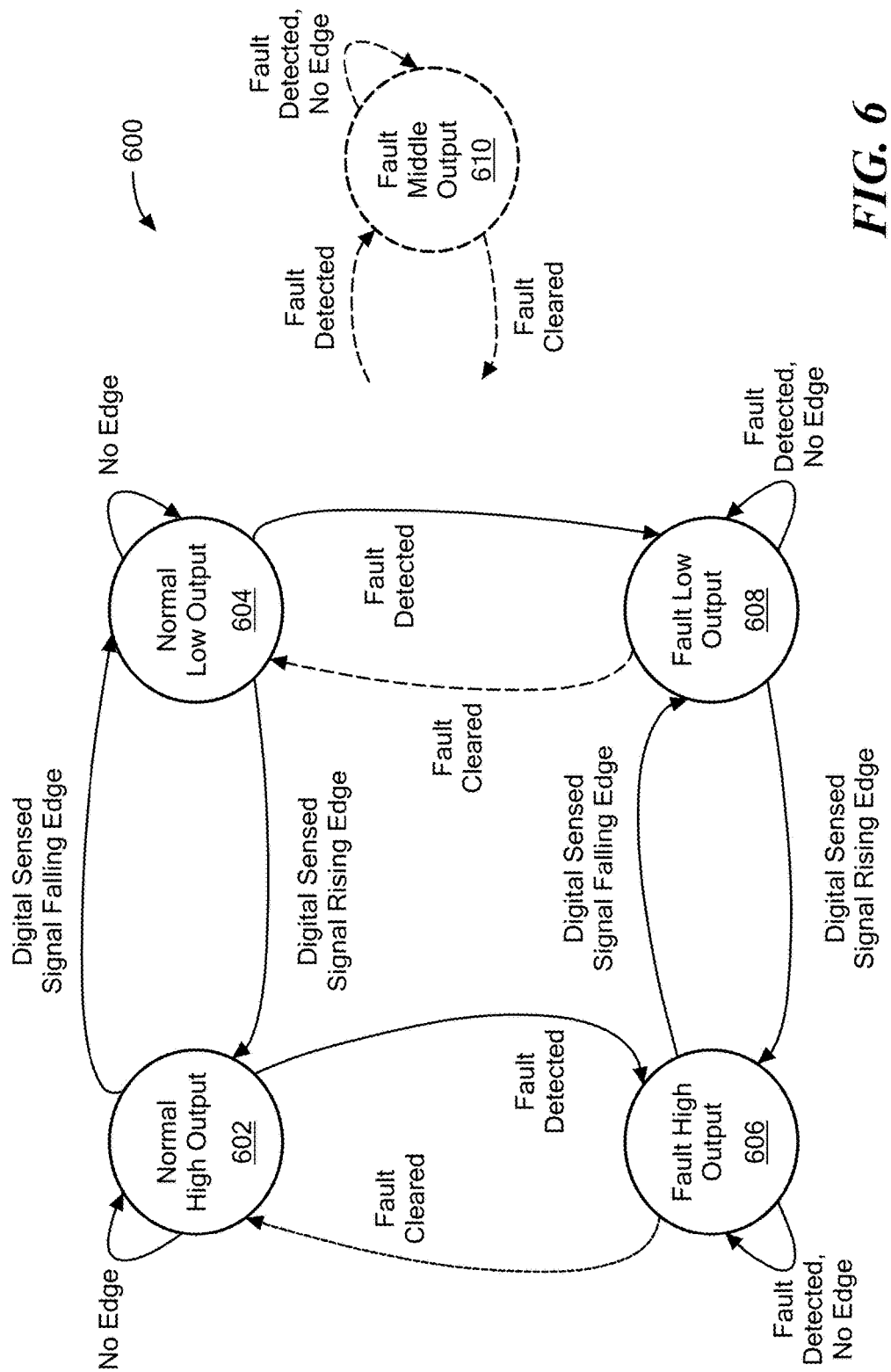
FIG. 6 is a state diagram showing illustrative operating states and state transition conditions of the sensor system of FIG. 1, in accordance with illustrative embodiments.

Referring to FIG. 6, state transition table 600 is an illustrative state transition diagram of sensor system 100. At startup of sensor system 100 (e.g., when sensor system 100 is first powered), digital signal 211 (or signal 213) may be set in order to transmit data signal 110 and if no fault condition is detected (e.g., by fault detector 112), then sensor system 100 operates in normal operation states 602 and 604. For example, if digital signal 211 is logic high, sensor system 100 operates at state 602 by setting output signal 110 to output high logic level 506. If digital signal 211 is logic low, sensor system 100 operates at state 604 by setting output signal 110 to output low logic level 508. As shown in FIG. 6, sensor system 100 stays at states 602 and 604, respectively, until the logic level of digital signal 211 changes. For example, if sensor system 100 is at state 602 (digital signal 211 is logic high), sensor system 100 stays at state 602 if no edge of digital signal 211 is detected. If a falling edge of digital signal 211 is detected, then sensor system 100 transitions from state 602 to state 604 and sets output signal 110 logic low (e.g., to output low logic level 508). Similarly, if sensor system 100 is at state 604 (digital signal 211 is logic low), sensor system 100 stays at state 604 if no edge of digital signal 211 is detected. If a rising edge of digital signal 211 is detected, then sensor system 100 transitions from state 604 to state 602 and sets output signal 110 logic high (e.g., to output high logic level 506).

If, at either of states 602 and 604, fault detector 112 detects a fault condition, then sensor system 100 transitions to operate in fault operation states 606 and 608, respectively. For example, if digital signal 211 is logic high, sensor system 100 operates at state 606 by setting output signal 110 to fault high logic level 504. If digital signal 211 is logic low, sensor system 100 operates at state 608 by setting output signal 110 to fault low logic level 510. As shown in FIG. 6, sensor system 100 stays at states 606 and 608, respectively, until the logic level of digital signal 211 changes. For example, if sensor system 100 is at state 606 (digital signal 211 is logic high), sensor system 100 stays at state 606 if no edge of digital signal 211 is detected. If a falling edge of digital signal 211 is detected, then sensor system 100 transitions from state 606 to state 608 and sets output signal 110 logic low (e.g., to fault low logic level 510). Similarly, if sensor system 100 is at state 608 (digital signal 211 is logic low), sensor system 100 stays at state 608 if no edge of digital signal 211 is detected. If a rising edge of digital signal 211 is detected, then sensor system 100 transitions from state 608 to state 606 and sets output signal 110 logic high (e.g., to fault high logic level 504).

As described herein, some embodiments may optionally employ fault middle logic level 514. For example, fault middle logic level 514 may communicate a specific fault condition. If, at any of operating states 602, 604, 606, and 608, the specific fault condition is detected, sensor system 100 transitions to operate in fault operation state 610.

As described herein, in some embodiments, once a fault condition is detected, sensor system 100 may remain in fault operation states 606 and 608 (or optional fault state 610) until sensor system 100 is reset, regardless of whether the fault condition has been resolved. As shown in FIG. 6, in other embodiments, if, at fault operation states 606 and 608, fault detector 112 detects that a fault condition has resolved (or cleared), then sensor system 100 transitions to operate in normal operation states 602 and 604, respectively.

Figure 7:
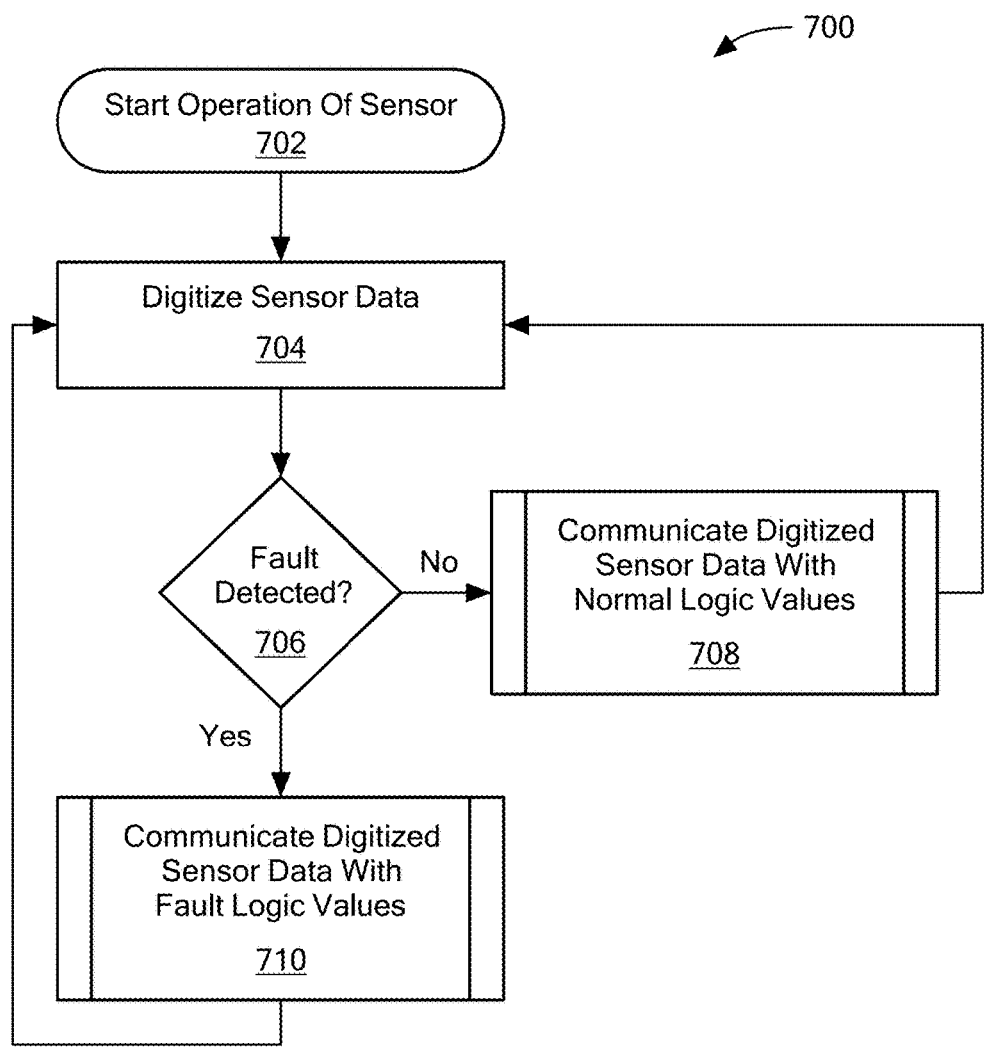
FIG. 7 is a flow diagram showing an illustrative process for operating the sensor system of FIG. 1, in accordance with illustrative embodiments.

Referring to FIG. 7, a flow diagram is shown of illustrative sensor operation process 700. At block 702, operation of sensor system 100 begins, for example upon power up of sensor system 100. At block 704, sensor system 100 may digitize analog sensor data and form data words for transmission as output signal 110. If sensor system employs digital sensors (e.g., sensors that directly output digital data), then at block 704, the digital data may be formed into data words for transmission as output signal 110. At block 706, if sensor system 100 (e.g., fault detector 112) detects a fault condition, then at block 710, sensor system 100 (e.g., output generator 108) generates output signal 110 at the fault logic levels, for example fault logic levels 504 and 510 as shown in FIG. 5. If, at block 706, sensor system 100 (e.g., fault detector 112) does not detect a fault condition, then at block 708, sensor system 100 (e.g., output generator 108) generates output signal 110 at the normal logic levels, for example output high logic level 506 and output low logic level 508 as shown in FIG. 5. After blocks 708 and 710, process 700 returns to block 704 to digitize additional data.

Figure 8:
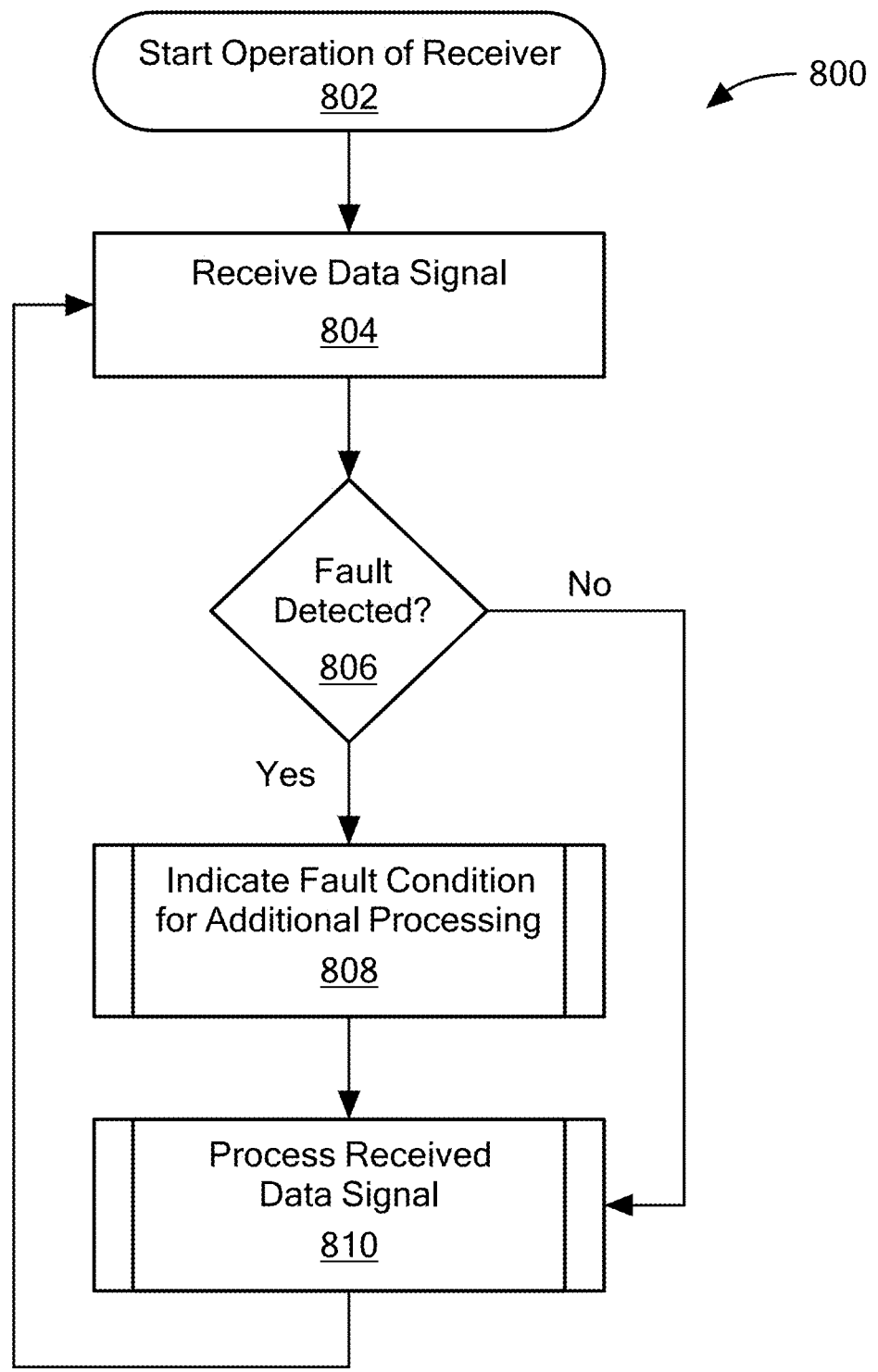
FIG. 8 is a flow diagram showing an illustrative process for operating a receiver coupled to the sensor system of FIG. 1, in accordance with illustrative embodiments.

Referring to FIG. 8, a flow diagram is shown of illustrative receiver operation process 800. As described herein, a receiver may be coupled to receive output signal 110 from sensor system 100. For example, sensor system 100 may be coupled to a vehicle ECU or ECM. At block 802, the receiver starts operation (e.g., at startup of the receiver). At block 804, output signal 110 is received. At block 806, the receiver determines the logic level(s) of the received signal. At block 806, if the received signal is at fault or OOB logic levels (e.g., fault high logic level 504, fault low logic level 510 or fault middle logic level 514), then at block 808, the receiver indicates an associated fault condition has been detected. In some embodiments, the fault condition may be provided for further processing, for example by the ECU or ECM, or otherwise indicated, for example to a driver of the vehicle. At block 810, the data of the received signal (e.g., the data indicated by the pulse train 502 of output signal 110) is processed by the receiver. For example, the receiver may determine sensor data of sensor system 100 from the received signal, in addition to determining the detected fault condition. After block 810, process 800 returns to block 804 to receive additional data.

At block 806, if the received signal is at normal of in-bounds logic levels (e.g., output high logic level 506 and output low logic level 508), then at block 810, the data of the received signal (e.g., the data indicated by the pulse train 502 of output signal 110) is processed by the receiver. For example, the receiver may determine sensor data of sensor system 100 from the received signal. After block 810, process 800 returns to block 804 to receive additional data.

In some embodiments, sensor system 100 may include one or more processors (for example, certain embodiments of controller 106 of FIG. 1). As used herein, the term "processor" describes an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals. In some embodiments, the "processor" can be embodied in an application specific integrated circuit (ASIC). In some embodiments, the "processor" can be embodied in a microprocessor with associated program memory. In some embodiments, the "processor" can be embodied in a discrete electronic circuit. The "processor" can be analog, digital or mixed-signal.

Various functions of circuit elements may also be implemented as processing blocks in a software program. Such software may be employed in, for example, a digital signal processor, microcontroller, or general purpose computer. Thus, described embodiments may be implemented in hardware, a combination of hardware and software, software, or software in execution by one or more processors.

Some embodiments may be implemented in the form of methods and apparatuses for practicing those methods. Described embodiments may also be implemented in the form of program code, for example, stored in a storage medium, loaded into and/or executed by a machine, or transmitted over some transmission medium or carrier, such as over electrical wiring or cabling, through fiber optics, or via electromagnetic radiation. A non-transitory machine-readable medium may include but is not limited to tangible media, such as magnetic recording media including hard drives, floppy diskettes, and magnetic tape media, optical recording media including compact discs (CDs) and digital versatile discs (DVDs), solid state memory such as flash memory, hybrid magnetic and solid state memory, non-volatile memory, volatile memory, and so forth, but does not include a transitory signal per se. When embodied in a non-transitory machine-readable medium, and the program code is loaded into and executed by a machine, such as a computer, the machine becomes an apparatus for practicing the method.

When implemented on a processing device, the program code segments combine with the processor to provide a unique device that operates analogously to specific logic circuits. Such processing devices may include, for example, a general purpose microprocessor, a digital signal processor (DSP), a reduced instruction set computer (RISC), a complex instruction set computer (CISC), an application specific integrated circuit (ASIC), a field programmable gate array (FPGA), a programmable logic array (PLA), a microcontroller, an embedded controller, a multi-core processor, and/or others, including combinations of the above. Described embodiments may also be implemented in the form of a bitstream or other sequence of signal values electrically or optically transmitted through a medium, stored magnetic-field variations in a magnetic recording medium, etc., generated using a method and/or an apparatus as recited in the claims.

Various elements, which are described in the context of a single embodiment, may also be provided separately or in any suitable subcombination. It will be further understood that various changes in the details, materials, and arrangements of the parts that have been described and illustrated herein may be made by those skilled in the art without departing from the scope of the following claims.

I claim:

1. An integrated circuit comprising:
a fault detector configured to detect a fault condition of the integrated circuit;
a controller configured to generate a controller output data signal; and
an output generator configured to generate an output signal of the integrated circuit and to:
generate the output signal at a first set of output levels based upon the controller output data signal when the fault detector does not detect the fault condition; and
generate the output signal at a second set of output levels based upon the controller output data signal when the fault detector detects the fault condition, wherein the second set of output levels is different than the first set of output levels and comprises a level of the output signal caused by an open circuit or a short circuit of the output signal.

2. The integrated circuit of claim 1, wherein the first set of output levels comprises an output low level and an output high level, and wherein the second set of output levels comprises a fault low output level and a fault high output level.

3. The integrated circuit of claim 2, wherein the fault low output level is lower than the output low level and wherein the fault high output level is higher than the output high level.

4. The integrated circuit of claim 2, wherein the output generator is further configured to generate the output signal at a middle output level when a selected fault condition is detected.

5. The integrated circuit of claim 4, wherein the middle output level is between the output low level and the output high level.

6. The integrated circuit of claim 1, wherein the fault detector is configured to cause the output signal to be at the second set of output levels to indicate the detected fault, and wherein the fault detector is configured to cause the output signal to be at the first set of output levels to indicate that the fault condition is not detected.

7. The integrated circuit of claim 6, wherein, once the fault condition is detected, the fault detector is configured to maintain the output signal at the second set of output levels until the integrated circuit is reset.

8. The integrated circuit of claim 2, wherein the output generator comprises:
a fault signal generator configured to generate a fault output signal based upon the controller output data signal, the first set of output levels, the second set of output levels, and a fault indicator;
an amplifier configured to generate an amplified output signal based upon the fault output signal and a feedback signal; and
a switching element configured to generate the output signal based upon the amplified output signal.

9. The integrated circuit of claim 8, wherein the fault signal generator comprises:
a first multiplexer configured to select, based upon the fault indicator, between the output high level of the first set of output levels and the fault high output level of the second set of output levels to generate a selected high signal;
a second multiplexer configured to select, based upon the fault indicator, between the output low level of the first set of output levels and the fault low output level of the second set of output levels to generate a selected low signal; and
a third multiplexer configured to select, based upon the controller output data signal, between the selected high signal and the selected low signal to generate the fault output signal.

10. The integrated circuit of claim 1, wherein the integrated circuit comprises a magnetic field sensor configured to sense at least one of an absolute position, a relative position, a direction of movement, a speed of movement, a direction of rotation, or a speed of rotation of a ferromagnetic object located proximate to the integrated circuit.

11. The integrated circuit of claim 10, wherein the integrated circuit is configured for use as a sensor in a vehicle, and wherein the output signal of the integrated circuit is coupled to a vehicle controller.

12. The integrated circuit of claim 11, wherein the vehicle controller is configured to decode a fault condition when the output signal is at the second set of output levels and process the fault condition in accordance with an Automotive Safety Integrity Level (ASIL) standard.

13. The integrated circuit of claim 11, wherein the fault detector is configured to detect fault conditions comprising one or more of: a voltage of the integrated circuit being out of an expected range, and a magnetic field sensed by the magnetic field sensor being out of an expected range.

14. A sensor comprising:
at least one magnetic field sensing element configured to generate a magnetic field signal indicative of a magnetic field sensed by the at least one magnetic field sensing element;
an analog-to-digital converter (ADC) configured to generate a digital magnetic field value associated with the magnetic field signal;
a controller configured to:
receive the digital magnetic field value and generate a sensed speed signal;
detect diagnostic faults of the sensor and generate a fault output signal based upon the detected diagnostic faults; and
an output generator configured to generate a sensor output signal and to:
receive the sensed speed signal and the fault output signal;
generate the sensor output signal at a first set of output levels based upon the sensed speed signal and a first value of the fault output signal; and
generate the sensor output signal at a second set of output levels based upon the sensed speed signal and a second value of the fault output signal, wherein the first set of output levels comprises an output low level and an output high level, and wherein the second set of output levels comprises a fault low output level and a fault high output level and wherein the fault low output level is lower than the output low level and wherein the fault high output level is higher than the output high level.

15. The sensor of claim 14, wherein the output generator is further configured to generate the output signal at a middle output level when a selected diagnostic fault is detected, wherein the middle output level is between the output low level and the output high level.

16. The sensor of claim 14, wherein, once a diagnostic fault is detected, the controller is configured to maintain the output signal at the second set of output levels until the controller is reset.

17. The sensor of claim 14, wherein the output generator comprises:
   a fault signal generator configured to generate a fault output signal based upon the sensed speed signal, the fault output signal, the first set of output levels, and the second set of output levels;
   an amplifier configured to generate an amplified output signal based upon the fault output signal and a feedback signal; and
   a switching element configured to generate the output signal based upon the amplified output signal.

18. The sensor of claim 17, wherein the fault signal generator comprises:
   a first multiplexer configured to select, based upon the fault output signal, between the output high level of the first set of output levels and the fault high output level of the second set of output levels to generate a selected high signal;
   a second multiplexer configured to select, based upon the fault output signal, between the output low level of the first set of output levels and the fault low output level of the second set of output levels to generate a selected low signal; and
   a third multiplexer configured to select, based upon the sensed speed signal, between the selected high signal and the selected low signal to generate the fault output signal.

19. The sensor of claim 14, wherein the at least one magnetic field sensing element is configured to sense at least one of an absolute position, a relative position, a direction of movement, a speed of movement, a direction of rotation, or a speed of rotation of a ferromagnetic object located proximate to the integrated circuit.

20. The sensor of claim 19, wherein the sensor is configured for use as a sensor in a vehicle, and wherein the output signal of the sensor is coupled to a vehicle controller, the vehicle controller configured to decode a diagnostic fault when the output signal is at the second set of output levels and process the diagnostic fault in accordance with an Automotive Safety Integrity Level (ASIL) standard.

21. The sensor of claim 19, wherein the detected diagnostic faults comprise one or more of: a voltage of the integrated circuit being out of an expected range, and a magnetic field sensed by the magnetic field sensor being out of an expected range.

22. The sensor of claim 14, wherein the sensor is implemented in an integrated circuit.

23. A method for communicating fault conditions of an integrated circuit, the method comprising:
   detecting, by a fault detector, a fault condition of the integrated circuit;
   generating, by a controller, a controller output data signal; and
   generating, by an output generator, an output signal of the integrated circuit at a first set of output levels based upon the controller output data signal when the fault detector does not detect the fault condition; and
   generating, by the output generator, the output signal at a second set of output levels based upon the controller output data signal when the fault detector detects the fault condition, wherein the second set of output levels is different than the first set of output levels and comprises a level of the output signal caused by an open circuit or a short circuit of the output signal.

24. The method of claim 23, wherein the first set of output levels comprises an output low level and an output high level, and wherein the second set of output levels comprises a fault low output level and a fault high output level.

25. The method of claim 24, wherein the fault low output level is lower than the output low level and wherein the fault high output level is higher than the output high level.

26. The method of claim 24, further comprising generating, by the output generator, the output signal at a middle output level when a selected fault condition is detected, wherein the middle output level is between the output low level and the output high level.

27. The method of claim 23, further comprising:
   generating, by the output generator, the output signal at the second set of output levels to indicate the detected fault; and
   generating, by the output generator, the output signal at the first set of output levels to indicate that the fault condition is not detected.

28. The method of claim 27, further comprising, once the fault condition is detected, maintaining the output signal at the second set of output levels until the integrated circuit is reset.

29. The method of claim 24, wherein the output generator comprises a fault signal generator, an amplifier and a switching element, the method further comprising:
   generating, by the fault signal generator, a fault output signal based upon the controller output data signal, the first set of output levels, the second set of output levels, and a fault indicator;
   generating, by the amplifier, an amplified output signal based upon the fault output signal and a feedback signal; and
   generating, by the switching element, the output signal based upon the amplified output signal.

30. The method of claim 29, wherein the fault signal generator comprises a first multiplexer, a second multiplexer, and a third multiplexer, the method further comprising:
   selecting, by the first multiplexer based upon the fault indicator, between the output high level of the first set of output levels and the fault high output level of the second set of output levels and generating a selected high signal;
   selecting, by the second multiplexer based upon the fault indicator, between the output low level of the first set of output levels and the fault low output level of the second set of output levels and generating a selected low signal; and
   selecting, by the third multiplexer based upon the controller output data signal, between the selected high signal and the selected low signal and generating the fault output signal.

31. The method of claim 23, wherein the integrated circuit comprises a magnetic field sensor, the method further comprising sensing, by the magnetic field sensor, at least one of an absolute position, a relative position, a direction of movement, a speed of movement, a direction of rotation, or a speed of rotation of a ferromagnetic object located proximate to the integrated circuit.

32. The method of claim 31, wherein the integrated circuit is configured for use as a sensor in a vehicle, and wherein the output signal of the integrated circuit is coupled to a vehicle controller, the method further comprising, decoding, by the vehicle controller, a fault condition when the output signal is at the second set of output levels and process the fault condition in accordance with an Automotive Safety Integrity Level (ASIL) standard.

33. The method of claim 31, wherein the fault conditions comprise one or more of: a voltage of the integrated circuit being out of an expected range, and a magnetic field sensed by the magnetic field sensor being out of an expected range.

34. A method for operating a vehicular sensor, the method comprising:
    generating, by at least one magnetic field sensing element of the vehicular sensor, a magnetic field signal indicative of a sensed magnetic field;
    generating, by an analog-to-digital converter (ADC) of the vehicular sensor, a digital magnetic field value associated with the magnetic field signal;
    by a controller of the vehicular sensor:
        receiving the digital magnetic field value and generating a sensed speed signal;
        detecting diagnostic faults of the vehicular sensor and generating a fault output signal based upon the detected diagnostic faults; and
    by an output generator of the vehicular sensor:
        receiving the sensed speed signal and the fault output signal;
        generating a sensor output signal at a first set of output levels based upon the sensed speed signal and a first value of the fault output signal; and
        generating the sensor output signal at a second set of output levels based upon the sensed speed signal and a second value of the fault output signal, wherein the first set of output levels comprises an output low level and an output high level, and wherein the second set of output levels comprises a fault low output level and a fault high output level, wherein the fault low output level is lower than the output low level and wherein the fault high output level is higher than the output high level.

35. The method of claim 34, further comprising generating, by the output generator, the output signal at a middle output level when a selected fault condition is detected, wherein the middle output level is between the output low level and the output high level.

36. The method of claim 34, further comprising maintaining the output signal at the second set of output levels until the controller is reset.

37. The method of claim 34, wherein the output generator comprises a fault signal generator, an amplifier and a switching element, the method further comprising:
    generating, by the fault signal generator, a fault output signal based upon the sensed speed signal, the first set of output levels, the second set of output levels, and a fault indicator;
    generating, by the amplifier, an amplified output signal based upon the fault output signal and a feedback signal; and
    generating, by the switching element, the output signal based upon the amplified output signal.

38. The method of claim 37, wherein the fault signal generator comprises a first multiplexer, a second multiplexer, and a third multiplexer, the method further comprising:
    selecting, by the first multiplexer based upon the fault indicator, between the output high level of the first set of output levels and the fault high output level of the second set of output levels and generating a selected high signal;
    selecting, by the second multiplexer based upon the fault indicator, between the output low level of the first set of output levels and the fault low output level of the second set of output levels and generating a selected low signal; and
    selecting, by the third multiplexer based upon the sensed speed signal, between the selected high signal and the selected low signal and generating the fault output signal.

39. The method of claim 34, wherein the integrated circuit comprises a magnetic field sensor, the method further comprising sensing, by the magnetic field sensor, at least one of an absolute position, a relative position, a direction of movement, a speed of movement, a direction of rotation, or a speed of rotation of a ferromagnetic object located proximate to the integrated circuit.

40. The method of claim 39, wherein the integrated circuit is configured for use as a sensor in a vehicle, and wherein the output signal of the integrated circuit is coupled to a vehicle controller, the method further comprising, decoding, by the vehicle controller, a fault condition when the output signal is at the second set of output levels and process the fault condition in accordance with an Automotive Safety Integrity Level (ASIL) standard.

41. The method of claim 39, wherein the fault conditions comprise one or more of: a voltage of the integrated circuit being out of an expected range, and a magnetic field sensed by the magnetic field sensor being out of an expected range.

* * * * *

UNITED STATES PATENT AND TRADEMARK OFFICE
CERTIFICATE OF CORRECTION

PATENT NO.        : 10,216,559 B2
APPLICATION NO.   : 15/350400
DATED             : February 26, 2019
INVENTOR(S)       : Devon Fernandez Page 1 of 1

It is certified that error appears in the above-identified patent and that said Letters Patent is hereby corrected as shown below:

In the Specification

Column 2, Line 42 delete "FIG. 4," and replace with --FIG. 3,--.

Column 4, Line 36 delete "to detect, motion," and replace with --to detect motion,--.

Column 9, Line 34 delete "time to and" and replace with --time $t_0$ and--.

Column 9, Line 43 delete "time to and time when" and replace with --time $t_0$ and time $t_1$ when--.

Signed and Sealed this
Twenty-ninth Day of October, 2019

Andrei Iancu
*Director of the United States Patent and Trademark Office*